US010656192B2

(12) United States Patent
Carrasco Espinosa et al.

(10) Patent No.: US 10,656,192 B2
(45) Date of Patent: May 19, 2020

(54) DEVICE FOR MEASURING A WIRELESS RADIO FREQUENCY CHANNEL WITH DIRECTIONAL MEASUREMENT ABILITY (ANGULAR)

(71) Applicant: UNIVERSIDAD TÉCNICA FEDERICO SANTA MARÍA, Valparaíso (CL)

(72) Inventors: Héctor Mario Carrasco Espinosa, Viña del Mar (CL); René Jaime Alwin Pozo Puschmann, Viña del Mar (CL); Leonardo Andrés Guerrero Flores, Quilpué (CL)

(73) Assignee: UNIVERSIDAD TÉCNICA FEDERICO SANTA MARÍA, Valparaiso (CL)

(*) Notice: Subject to any disclaimer, the term of this patent is extended or adjusted under 35 U.S.C. 154(b) by 321 days.

(21) Appl. No.: 15/858,571

(22) Filed: Dec. 29, 2017

(65) Prior Publication Data

US 2018/0188304 A1 Jul. 5, 2018

Related U.S. Application Data

(60) Provisional application No. 62/441,808, filed on Jan. 3, 2017.

(51) Int. Cl.
*H04W 24/08* (2009.01)
*G01R 29/08* (2006.01)
*H04B 17/318* (2015.01)

(52) U.S. Cl.
CPC ..... *G01R 29/0871* (2013.01); *G01R 29/0885* (2013.01); *H04B 17/318* (2015.01); *H04W 24/08* (2013.01); *G01R 29/0892* (2013.01)

(58) Field of Classification Search
CPC ...... H04B 17/318; H04W 24/08; G01R 29/08
USPC ............................................. 343/703
See application file for complete search history.

(56) References Cited

FOREIGN PATENT DOCUMENTS

| WO | 94/26001 | 11/1994 | |
|---|---|---|---|
| WO | WO-9426001 A1 * | 11/1994 | ............. H01Q 21/28 |
| WO | 99/65162 | 12/1999 | |

\* cited by examiner

*Primary Examiner* — Andrea Lindgren Baltzell
(74) *Attorney, Agent, or Firm* — Hamre, Schumann, Mueller & Larson, P.C.

(57) ABSTRACT

A device (1) for measuring a wireless channel in any frequency band, with the device rotating and being autonomous. The device (1) comprises at least one antenna (2) that is connected to a processor (3) and powered by a battery, with all being mounted on a rotary platform (5), and with the processor (3) being complimented by at least one encoder (6) located in the stationary portion of the device (1) and an axle (7) of the rotary platform (5) that is connected to a motor (8) via the axle (7) in order to drive the rotary platform (5). The device (1) makes it possible to perform evaluations of the channel of the electromagnetic spectrum, not necessarily for 60 GHz. This autonomy makes it possible to perform measurements on the ground in a simple manner without the need to carry around complex equipment or additional power sources. In addition, since it permits rotation at different speeds, it can measure changes in the medium that are impossible to measure using other equipment that is limited in terms of rotational speed.

17 Claims, 2 Drawing Sheets

DEVICE FOR MEASURING A WIRELESS RADIO FREQUENCY CHANNEL WITH DIRECTIONAL MEASUREMENT ABILITY (ANGULAR)

FIELD OF APPLICATION

The present invention relates to the area of telecommunications, particularly to a device or instrument for measuring a wireless channel on any frequency band.

BACKGROUND

At present, various solutions exist which pertain to the measurement of wireless channels by means of rotary devices.

Document WO 94/26001, dated 10 Nov. 1994, by inventors MERENDA JOSEPH T; LOPEZ ALFRED R, titled "STEERABLE ANTENNA SYSTEMS," discloses an antenna system in the 60 GHz frequency range that utilizes a simplified rotary joint in order to enable the antenna to move. In particular, this system utilizes a combination of antenna and reflector, both on a rotary platform, wherein the captured signals are transmitted to the stationary portion by means of a "probe element," which acquires the signals from the reflectors and, in turn, transmits them to the stationary portion. This device considers the use of horn antennas that rotate in order to acquire short waves, and the invention that is described seeks to provide rotary joints that optimize the wireless transmission of signals in the 60 GHz range.

On the other hand, document WO1999065162, dated 16 Dec. 1999, by inventor FITZ STEPHEN MARK, titled "TRANSMITTER, RECEIVER AND TRANSCEIVER APPARATUS," discloses a transceiver apparatus which comprises a set of unidirectional antennas. Each set of antennas has its own radio subsystem for providing a radio output signal for transmission by one of the antennas of the set and for receiving a signal received by one of the antennas in order to provide an output signal from the radio subsystem. Each one of the radio subsystems has a switch. The switch is operated to switch the output of the radio subsystem to a selected one of the antennae in the set for transmission of a radio signal by said selected antenna. This document mentions the possibility of operating in the 60 GHz range and discloses the use of antennas and processing devices that are mounted on a rotary platform.

The drawbacks of the abovementioned solutions include the fact that they enable data to be neither measured nor captured; they do not perform registration of angles, nor do they specify the speed at which they can rotate, as they constitute mere measuring instruments.

SUMMARY OF THE INVENTION

The invention relates to a device or instrument for measuring a wireless channel in any frequency band, particularly in the 60 GHz band, which consists specifically of an instrument for measuring a wireless RF channel that rotates and is autonomous, with the entire assembly being caused to rotate together while avoiding sophisticated and expensive high-frequency connection devices that comprise stationary subsystems.

In particular, the technology comprises a configuration that includes an antenna—which, in a preferred embodiment, can be a horn-type directional antenna—that is connected to a processor and is powered by a battery, with everything being mounted on a rotary platform. The data readout is stored in the processor and is complemented by an encoder that is located in the stationary portion of the system.

The processor coordinates the measuring of the signal and the angular position of the entire rotary system that the stationary encoder supplies. There is also a speed control (RPM) in the stationary portion.

The effect that the antenna is mounted on a rotary plate makes it possible to generate a scan of the environment in the manner of a radar, which enables connections in this environment to be studied while directionally differentiating the typical multiple paths that are produced on a radio channel in real environments with reflections, etc.; this requires the use of a directional antenna—that is, an antenna that has an angular reception range or zone that is sufficiently small, i.e., has a sufficient angular resolution.

The critical aspect with regard to the antenna type is that is be directional, that is, that it point in a specific direction. The frequency and the gain of the antenna is of no great importance. With respect to the rotational speed, it is important that it be sufficiently fast depending on the speed to which the environment changes. In other words, if it rotates very slowly, it will not work.

The important aspect of the platform is that it be capable of measuring changes in the wireless connection in a dynamic environment. To this end, the antenna must be directional and the platform must rotate at a minimum speed, which will depend on the environment and on the frequency of the connection. This platform is capable of rotating at different speeds, which gives it a lot of flexibility. It also permits the antenna to be changed, which also gives it flexibility to measure at different frequencies.

If an antenna that is not directional were to be used, the platform could be used to measure other variables such as the spatial variation of the connection, for example.

Unlike the solutions of the prior art, the device is autonomous, enabling evaluations to be made of the channel of the electromagnetic spectrum. It is not necessarily for 60 GHz. This autonomy makes it possible to perform measurements on the ground in a simple manner without the need to carry around complex equipment or additional power sources. In addition, since it permits rotation at different speeds, it can measure changes in the medium that are impossible to measure using other equipment that is limited in terms of rotational speed.

DETAILED DESCRIPTION OF THE INVENTION

Figure 1:
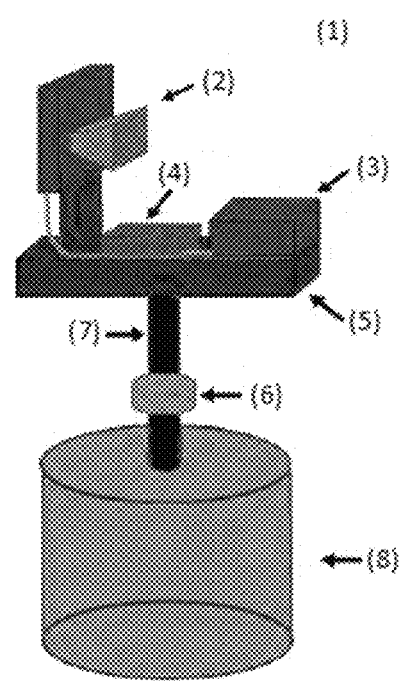
FIG. 1 shows a schematic view of the device according to a preferred embodiment of the invention.

The invention relates to a device (1) for measuring a wireless channel in any frequency band, particularly in the 60 GHz band. The device (1) consists specifically of an instrument for measuring a wireless RF (radio frequency) channel that rotates and is autonomous, with the entire device (1) being caused to rotate together while avoiding sophisticated and expensive high-frequency connection devices that comprise stationary subsystems.

The device (1) comprises at least one antenna (2). in a preferred embodiment of the invention, the antenna (2) is a horn-type directional antenna that is connected to a processor (3) and powered by a battery (4), with all being mounted on a rotary platform or rotary support (5). The data readout is stored in the processor and is complemented by at least one encoder (6), which consists of a grooved disc located in the stationary portion of the device (1), and optical sensors that are anchored to the rotary support (5), preferably on an axle (7) of the rotary support (5). The rotary platform (5) is driven by a motor (8), preferably a DC motor.

The processor coordinates the measuring of the signal and the angular position of the entire rotary system that the stationary encoder (6) supplies. The preferred embodiment of the invention also includes the possibility of mounting a speed control (RPM) on the stationary portion of the device.

The effect that the antenna is mounted on a rotary platform makes it possible to generate a scan of the environment in the manner of a radar, which enables connections in this environment to be studied while directionally differentiating the typical multiple paths that are produced on a radio frequency channel in real environments with reflections, etc.; this requires the use of a directional antenna—that is, an antenna that has an angular reception range or zone that is sufficiently small, i.e., has a sufficient angular resolution.

The critical aspect with regard to the antenna type is that is be directional, that is, that it point in a specific direction. The frequency and the gain of the antenna is of no great importance. With respect to the rotational speed, it is important that it be sufficiently fast depending on the speed to which the environment changes. In other words, if it rotates very slowly, it will not work.

The important aspect of the rotary platform (5) is that it be capable of measuring changes in the wireless connection in a dynamic environment. To this end, the antenna (2) must be directional and the rotary platform (5) must rotate at a minimum speed, which will depend on the environment and on the frequency of the connection. This rotary platform (5) is capable of rotating at different speeds, which gives it a lot of flexibility for measuring frequencies in different directions. It also enables the antenna (2) to be changed, which also gives it flexibility to measure at different frequencies.

If an antenna that is not directional were to be used, the rotary platform (5) could be used to measure other variables such as the spatial variation of the connection, for example.

In a preferred embodiment of the invention, a conceptual view of which is shown in FIG. 1, the device (1) consists of a motor (8) that causes the rotary support or platform (5) to rotate at 300 RPM. On this rotary platform (5) is mounted a 60 GHz receiver module together with a power meter (for measuring the power level) such as a Raspberry Pi 2 (low-cost single-board computer, one-board computer, or monoboard computer) for data acquisition and the battery required for powering the receiver and the Raspberry Pi 2, which constitutes the processor (3) in the preferred embodiment. The material used for the rotary platform (5) is tecnil, which is a light and rigid plastic while preventing the motor (8) from having to exert too much torque and also preventing the reflection of electromagnetic waves that might alter the measurements. In order to be able to correlate each measurement of power received with an angular position, an encoder (6) is used which consists of a fixed platen and a photoreceiver that is connected to the processor (3) in order to correlate the power data with the angle measured at that instant. On the other hand, the motor (8) is configured by means of a controller so as to operate at a fixed speed, approximately 300 RPM.

In one embodiment of the invention, the power meter used is a device that has an SMA coaxial connector as an input and a USB port as an output. This makes it possible to measure RF power between 1 MHz and 500 MHz and to deliver the data through a USB serial port in dBm. As an example, the power meter comprises an ATMEGA328 processor; it is also possible to modify its firmware using the same software available for Arduino (an open-source platform for electronic prototypes based on flexible and easy-to-use hardware and software).

In one embodiment of the invention, the encoder (6) consists of two parts. The first is a disc measuring approximately 10 cm in diameter that has 90 notches located symmetrically around its edge for measuring the angle, with one of these 90 notches being elongate in order to perform the "home" function required to measure RPM. The other part consists of two H21A2 photoemitters/photoreceivers with which it is possible—in conjunction with the processor—to generate two square signals. The photoemitters are powered by 5 V from the processor, whereas the photoreceivers are powered by 3.3 V. The latter operate at 3.3 V due to the fact that the ports of the processor operate at that very voltage; in turn, resistors were used in order to limit the current through the ports of the processor, so the operating voltages of the signals are approximately 160 mV and 2.8 V. These levels are adequate, since the processor makes the logical differentiation between 0 and 1 in 1.8 V. It is important to mention that the limitation of this encoder (6) is that it is incapable of detecting the direction of rotation; however, that is not necessary for this application.

Exemplary Application

Figure 2:
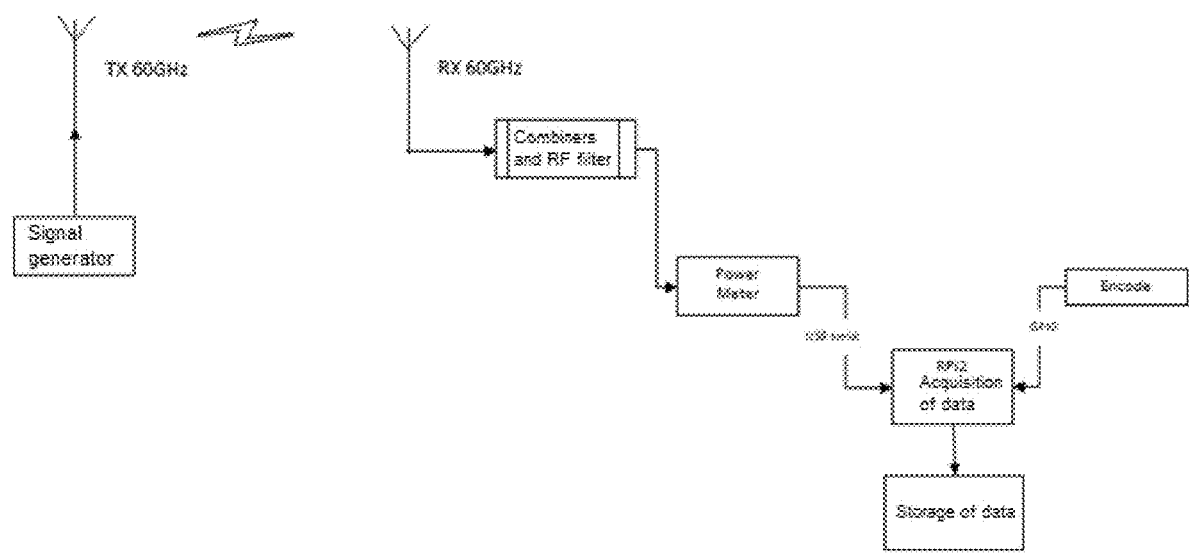
FIG. 2 shows an example of the operating layout according to an exemplary embodiment of the invention.

FIG. 2 shows a diagram of how the device operates. To measure the channel, a pure tone is generated at 70 MHz, which is raised to 60 GHz and transmitted by means of a VubIQ transmitter module. The 60 GHz signal is then received by a receiver module and lowered to baseband. The differential signal delivered by the receiver module is then passed first through some combiners and a 70 MHz bandpass filter and then to the power meter. The power meter handles the integration of the power in order to then provide a measurement in dBm to two decimal places of precision through a USB serial port to the Raspberry Pi 2. At the same time, the Raspberry Pi 2 reads two square signals from GPIO ports that are generated by the photosensors of the encoder (6). Using these two signals, the Raspberry calculates the angle and rotational speed of the rotary platform (5) for each instant. Finally, a data acquisition program correlates each power, angle, and speed measurement and time of capture and saves them in a .CSV file. These measurements can be stored or sent in real time to be displayed as they are retrieved.

The invention claimed is:

1. A device (1) for measuring a wireless channel in any frequency band, with the device rotating and being autonomous, characterized in that the device (1) comprises at least one antenna (2) that is connected to a processor (3) and powered by a battery, with all being mounted on a rotary platform (5), and with the processor (3) being complimented by at least one encoder (6) located in the stationary portion of the device (1) and an axle (7) of the rotary platform (5) that is connected to a motor (8) via the axle (7) in order to drive the rotary platform (5).

2. The device of claim 1, characterized in that the frequency band is the 60 GHz band.

3. The device of claim 1, characterized in that the antenna (2) is a horn-type directional antenna.

4. The device of claim 3, characterized in that the antenna (2) is a directional antenna.

5. The device of claim 1, characterized in that the encoder (6) is located on the axle (7) of the rotary platform (5).

6. The device of claim 1, characterized in that the motor is a DC motor.

7. The device of claim 6, characterized in that the motor turns at 300 RPM.

8. The device of claim 7, characterized in that the motor comprises a controller for controlling the fixed speed.

9. The device of claim 1, characterized in that it further comprises a speed control (RPM) in the stationary portion of the device.

10. The device of claim 1, characterized in that the processor further comprises a 60 GHz receiver module, a power meter, as well as a Raspberry Pi 2 for data acquisition, and the required battery for supplying the receiver and the Raspberry Pi 2.

11. The device of claim 10, characterized in that the power meter is a device that has an SMA coaxial connector as an input and a USB port as an output.

12. The device of claim 1, characterized in that the rotary platform (5) is made of tecnil.

13. The device of claim 1, characterized in that the encoder (6) comprises a fixed platen and at least one photoemitter/photoreceiver that is connected to the processor (3) in order to correlate the power data with the angle measured at that instant.

14. The device of claim 13, characterized in that the fixed platen is a disc measuring approximately 10 cm in diameter that has 90 notches located symmetrically around its edge for measuring the angle, with one of these 90 notches being elongate in order to perform the "home" function required to measure RPM.

15. The device of claim 13, characterized in that it comprises two photoemitters/photoreceivers.

16. The device of claim 15, characterized in that the photoemitters are powered by 5 V from the processor.

17. The device of claim 15, characterized in that the photoreceivers are powered by 3.3 V from the processor.

* * * * *